US012631922B2

(12) United States Patent
Wang et al.

(10) Patent No.: US 12,631,922 B2
(45) Date of Patent: May 19, 2026

(54) DISPLAY SUBSTRATE, DISPLAY PANEL AND DISPLAY DEVICE

(71) Applicant: BOE Technology Group Co., Ltd., Beijing (CN)

(72) Inventors: Lizhong Wang, Beijing (CN); Yunping Di, Beijing (CN); Jinchao Zhang, Beijing (CN); Rui Huang, Beijing (CN); Liping Lei, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/021,121

(22) PCT Filed: Jun. 23, 2022

(86) PCT No.: PCT/CN2022/100678
§ 371 (c)(1),
(2) Date: Feb. 13, 2023

(87) PCT Pub. No.: WO2023/245539
PCT Pub. Date: Dec. 28, 2023

(65) Prior Publication Data
US 2024/0264497 A1 Aug. 8, 2024

(51) Int. Cl.
*G02F 1/1362* (2006.01)
*G02F 1/1368* (2006.01)
(Continued)

(52) U.S. Cl.
CPC .. *G02F 1/136209* (2013.01); *G02F 1/136286* (2013.01); *G02F 1/1368* (2013.01);
(Continued)

(58) Field of Classification Search
CPC ................................................ G02F 1/13628
See application file for complete search history.

(56) References Cited

U.S. PATENT DOCUMENTS

| | | | | | |
|---|---|---|---|---|---|
| 5,233,211 | A | * | 8/1993 | Hayashi | ............ H10D 30/6723 |
| | | | | | 257/659 |
| 6,195,140 | B1 | * | 2/2001 | Kubo | .................. G02F 1/13439 |
| | | | | | 349/44 |

(Continued)

FOREIGN PATENT DOCUMENTS

| | | |
|---|---|---|
| CN | 105911787 A | 8/2016 |
| CN | 106098699 A | 11/2016 |

(Continued)

*Primary Examiner* — Richard H Kim
(74) *Attorney, Agent, or Firm* — IPro, PLLC

(57) ABSTRACT

A display substrate includes: a base substrate including a display area and a frame area on at least one side of the display area; a first transistor in the frame area including a first active layer; a second transistor in the display area including a second active layer at a side of the first active layer facing away from the base substrate, the second active layer including a first channel region; and a light shielding layer in the display area. The light shielding layer contains the same element as the first active layer. A material of the light shielding layer can absorb at least part of ultraviolet light and transmit part of visible light. An orthogonal projection of the light shielding layer on the base substrate covers an orthogonal projection of the first channel region on the base substrate.

19 Claims, 9 Drawing Sheets

(51) Int. Cl.
| | |
|---|---|
| *H10D 86/40* | (2025.01) |
| *H10D 86/60* | (2025.01) |
| *H10K 59/121* | (2023.01) |
| *H10K 59/126* | (2023.01) |
| *H10K 59/131* | (2023.01) |

(52) U.S. Cl.
CPC ......... *H10D 86/423* (2025.01); *H10D 86/441* (2025.01); *H10D 86/60* (2025.01); *H10K 59/1213* (2023.02); *H10K 59/126* (2023.02); *H10K 59/131* (2023.02)

(56) References Cited

U.S. PATENT DOCUMENTS

| | | | | |
|---|---|---|---|---|
| 6,992,718 | B1 * | 1/2006 | Takahara | .......... G02F 1/133553 348/333.09 |
| 2004/0149989 | A1 * | 8/2004 | Matsunaga | ........ H10D 30/6723 257/E27.111 |
| 2005/0219444 | A1 * | 10/2005 | Misaki | .............. G02F 1/133555 349/110 |
| 2008/0017885 | A1 * | 1/2008 | Ishii | .................. G02F 1/136209 257/E27.113 |
| 2015/0069382 | A1 * | 3/2015 | Ahn | ................... H01L 27/1262 257/43 |

| | | | | |
|---|---|---|---|---|
| 2016/0260840 | A1 * | 9/2016 | Xie | ................... H01L 29/78696 |
| 2017/0031218 | A1 | 2/2017 | Li et al. | |
| 2017/0184900 | A1 * | 6/2017 | Jang | .................... G02F 1/13394 |
| 2018/0088390 | A1 * | 3/2018 | Ohara | .................. H10K 59/131 |
| 2019/0006389 | A1 | 1/2019 | Wang et al. | |
| 2020/0111433 | A1 * | 4/2020 | Kikuchi | .............. G09G 3/3648 |
| 2021/0181554 | A1 | 6/2021 | Hong et al. | |
| 2021/0263356 | A1 * | 8/2021 | Ishizaki | ........... G02F 1/136213 |
| 2021/0358977 | A1 * | 11/2021 | Zhang | ................ H01L 27/1225 |
| 2023/0051710 | A1 * | 2/2023 | Abe | ................... H10F 39/8023 |
| 2023/0094760 | A1 * | 3/2023 | Ai | ......................... G06F 3/0412 349/42 |
| 2023/0099934 | A1 | 3/2023 | Gong et al. | |
| 2024/0176197 | A1 * | 5/2024 | Ishikawa | .......... G02F 1/136222 |
| 2024/0178236 | A1 * | 5/2024 | Saitoh | ................... H10D 86/60 |

FOREIGN PATENT DOCUMENTS

| | | |
|---|---|---|
| CN | 107123656 A | 9/2017 |
| CN | 206618932 U | 11/2017 |
| CN | 112992920 A | 6/2021 |
| CN | 111725324 B | 11/2021 |
| CN | 113745246 A | 12/2021 |
| JP | 2000321601 A | 11/2000 |
| JP | 2009128520 A | 6/2009 |

* cited by examiner

DISPLAY SUBSTRATE, DISPLAY PANEL AND DISPLAY DEVICE

CROSS-REFERENCE OF RELATED APPLICATIONS

The present application is a national phase entry under 35 U.S.C. § 371 of International Application No. PCT/CN2022/100678, filed on Jun. 23, 2022.

FIELD

The present disclosure relates to the technical field of display, in particular to a display substrate, a display panel and a display device.

BACKGROUND

A liquid crystal display (LCD) has the advantages of light weight, low power consumption, high image quality, low radiation and portability, has gradually replaced a traditional cathode ray tube display (CRT), and is widely used in modern information equipment, such as virtual reality (VR) head-mounted display equipment, notebook computers, televisions, mobile phones and digital products.

SUMMARY

Embodiments of the present disclosure provide a display substrate, a display panel and a display device, and the scheme is as follows.

In one aspect, embodiments of the present disclosure provide a display substrate, including:

a base substrate, including a display area and a frame area located on at least one side of the display area;

a first transistor, located in the frame area, the first transistor including a first active layer;

a second transistor, located in the display area, the second transistor including a second active layer located at a side of the first active layer facing away from the base substrate, and the second active layer including a first channel region; and a light shielding layer, located in the display area, wherein the light shielding layer contains the same element as the first active layer, and a material of the light shielding layer can absorb at least part of ultraviolet light and transmit part of visible light; and an orthogonal projection of the light shielding layer on the base substrate covers an orthogonal projection of the first channel region on the base substrate.

In some embodiments, in the display substrate provided by the embodiments of the present disclosure, there are a plurality of second transistors, and the light shielding layer includes first light shielding structures that correspond to the second transistors one to one and are independent of each other.

In some embodiments, in the display substrate provided by the embodiments of the present disclosure, the first active layer is of a polysilicon material, and the second active layer is of a semiconductor oxide material.

In some embodiments, the display substrate provided by the embodiments of the present disclosure further includes a data line located at a side of the second active layer facing away from the light shielding layer, and an orthogonal projection of the data line on the base substrate and an orthogonal projection of the first light shielding structures on the base substrate do not overlap each other.

In some embodiments, in the display substrate provided by the embodiments of the present disclosure, there are a plurality of second transistors, the plurality of second transistors are arranged in an array, and the light shielding layer includes second light shielding structures each corresponding to a respective row of the second transistors.

In some embodiments, the display substrate provided by the embodiments of the present disclosure further includes a gate line and a data line sequentially arranged on a side of the second active layer facing away from the light shielding layer. The gate line and the data line are insulated from each other. An orthogonal projection of the gate line on the base substrate is within an orthogonal projection of the second light shielding structures on the base substrate, and an orthogonal projection of the data line on the base substrate partially overlaps an orthogonal projection of the second light shielding structures on the base substrate.

In some embodiments, in the display substrate provided by the embodiments of the present disclosure, the first active layer includes a second channel region, and a material of the second channel region is intrinsic polysilicon; and a material of the light shielding layer is intrinsic polysilicon.

In some embodiments, in the display substrate provided by the embodiments of the present disclosure, the first active layer includes a source region and a drain region, and materials of the source region and the drain region are n-type polysilicon; and a material of the light shielding layer is n-type polysilicon.

In some embodiments, the display substrate provided by the embodiments of the present disclosure further includes a first electrode located at a side of a layer where the second transistor is located facing away from the base substrate, and a switching electrode connecting the first electrode and the second active layer. A material of the switching electrode is a transparent conductive material.

In some embodiments, in the display substrate provided by the embodiments of the present disclosure, the second transistor includes a first source located between a layer where the switching electrode is located and the second active layer, and the polysilicon transistor includes a second source and a second drain in the same layer and with the same material as the first source.

In some embodiments, in the display substrate provided by the embodiments of the present disclosure, the second transistor includes a first gate located between a layer where the first source is located and the second active layer, and the polysilicon transistor includes a second gate in the same layer and with the same material as the first gate.

In some embodiments, the display substrate provided by the embodiments of the present disclosure further includes a planarization layer located between the layer where the first electrode is located and the layer where the switching electrode is located, and the planarization layer includes a first via hole connecting the first electrode and the switching electrode, and at least part of an orthogonal projection of the first via hole on the base substrate is located within an orthogonal projection of the first gate on the base substrate.

In some embodiments, the display substrate provided by the embodiments of the present disclosure further includes a first insulating layer located between the layer where the first electrode is located and the layer where the first source is located, an interlayer dielectric layer located between the layer where the first source is located and the layer where the first gate is located, and a gate insulating layer located between the layer where the first gate is located and the second active layer. The first insulating layer, the interlayer dielectric layer and the gate insulating layer include a second via holes penetrating through the first insulating layer, the interlayer dielectric layer and the gate insulating layer, and the switching electrode is connected with the second active layer through the second via hole.

In some embodiments, the display substrate provided by the embodiments of the present disclosure further includes a second electrode located at a side of the layer where the first electrode is located facing away from the base substrate.

In another aspect, embodiments of the present disclosure provide a display panel, including the display substrate provided by the embodiments of the present disclosure.

In some embodiments, the display panel provided by the embodiments of the present disclosure further includes an opposite substrate opposite to the display substrate, and a liquid crystal layer located between the display substrate and the opposite substrate.

In another aspect, embodiments of the present disclosure provide a display device, including the display panel provided by the embodiments of the present disclosure.

DETAILED DESCRIPTION OF THE EMBODIMENTS

Figure 1:
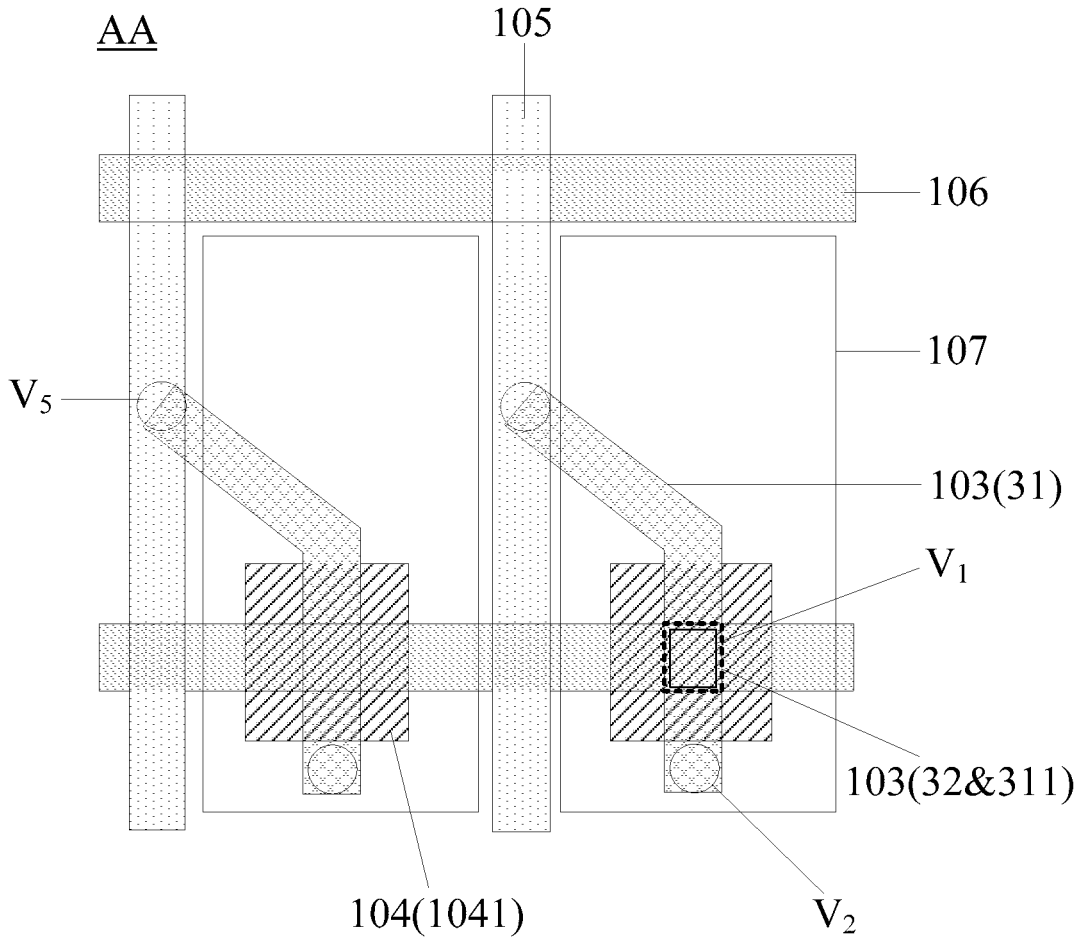
FIG. 1 is a schematic structural diagram of a display substrate provided by an embodiment of the present disclosure.

In order to make the objectives, technical solutions and advantages of the embodiments of the present disclosure clearer, the technical solutions of the embodiments of the present disclosure will be described clearly and completely below in combination with the accompanying drawings of the embodiments of the present disclosure. It should be noted that the dimensions and shapes of the figures in the accompanying drawings do not reflect the true scale, and are only intended to schematically illustrate the content of the present disclosure. The same or similar reference numerals indicate the same or similar elements or elements with the same or similar functions throughout. In order to keep the following description of the embodiments of the present disclosure clear and concise, detailed descriptions of known functions and known components are omitted in the present disclosure.

Unless otherwise defined, technical terms or scientific terms used herein shall have their ordinary meanings as understood by people with ordinary skills in the art to which the present disclosure belongs. The words "first", "second" and similar words used in the specification and claims of the present disclosure do not indicate any order, quantity or importance, but are only used to distinguish different components. Similar words such as "including" or "containing" mean that the elements or objects appearing before the word cover the elements or objects listed after the word and their equivalents, without excluding other elements or objects. "Inside", "outside", "up" and "down" are only used to express the relative positional relationships, and when the absolute position of the described object changes, the relative positional relationship may also change accordingly.

At present, liquid crystal display devices are mainly transistor (TFT) liquid crystal display devices. In some embodiments, transistors arranged in a frame area of a liquid crystal display device, such as transistors in a gate driver on array (GOA), include a first transistor; and transistors in a display area (AA) include a second transistor. However, with the continuous improvement of the pixels per inch (PPI) of the liquid crystal display device, it is necessary to arrange more second transistors in the display area, which leads to the gradual decrease of the transmittance of the liquid crystal display device. When the PPI exceeds 1500 PPI, the transmittance of related products is only about 1.5%. In order to ensure the display effect, the brightness of white backlight needs to be more than 20000 nits, even more than 30000 nits. An active layer in the transistor, exemplarily, a second active layer in the second transistor is sensitive to illumination, so high-intensity illumination requires higher illumination stability of the second transistor irradiated by backlight in the display area. Therefore, related products adopt a metal light shielding (LS) layer for light shielding design to ensure the normal characteristics of the transistor, but the larger light shielding layer further reduces the transmittance.

Figure 2:
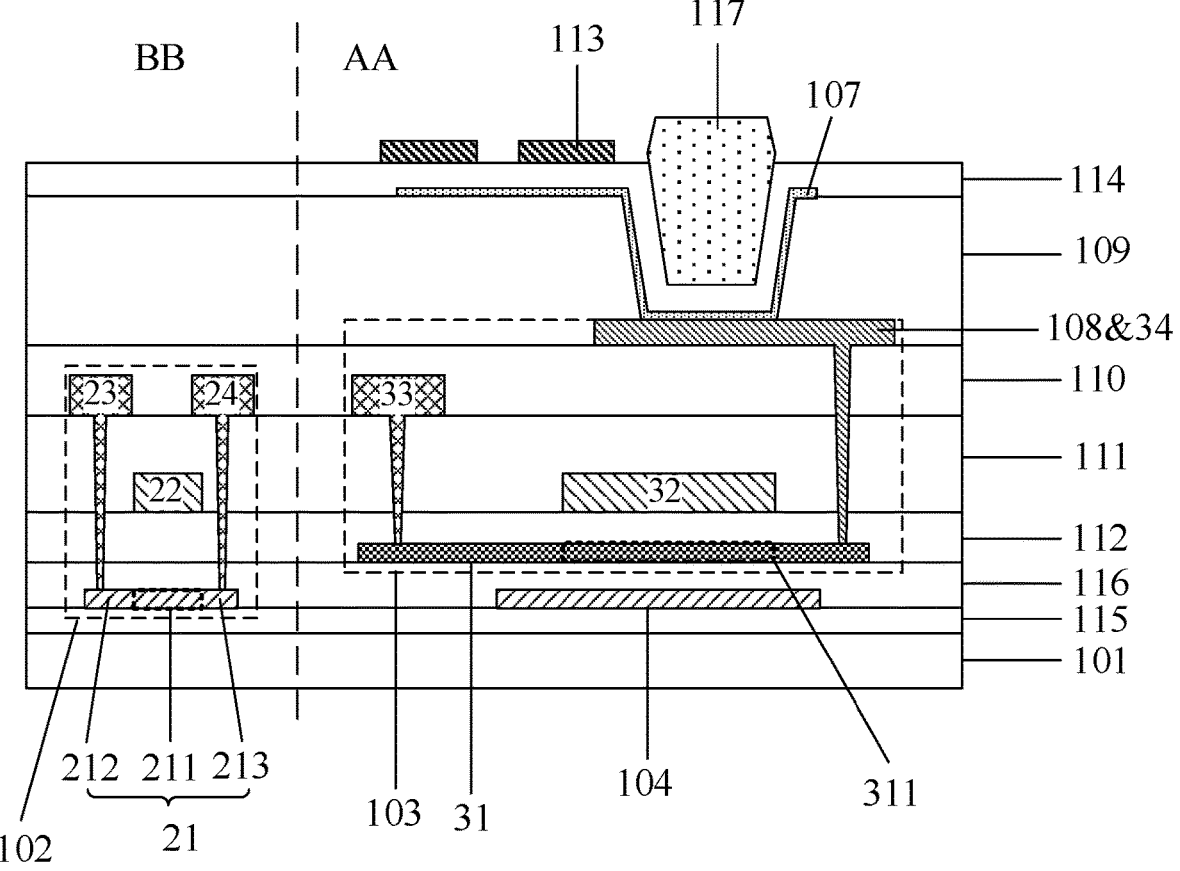
FIG. 2 is another schematic structural diagram of a display substrate provided by an embodiment of the present disclosure.

In order to alleviate the above technical problems existing in the related art, embodiments of the present disclosure provide a display substrate, as shown in FIGS. 1 and 2. The display substrate includes a base substrate 101, a first transistor 102, a second transistor 103, and a light shielding layer 104.

The base substrate 101 includes a display area AA and a frame area BB located on at least one side of the display area AA.

The first transistor 102 is located in the frame area BB. The first transistor 102 includes a first active layer 21. Optionally, a material of the first active layer 21 may be polysilicon.

The second transistor 103 is located in the display area AA. The second transistor 103 includes a second active layer 31 located on a side of the first active layer 21 far away from the base substrate 101. The second active layer 31 includes a first channel region 311. Optionally, a material of the second active layer 31 may be a semiconductor oxide material, such as any one or more of indium gallium zinc oxide (IGZO), amorphous or polycrystalline zinc oxide (ZnO), indium zinc oxide (IZO), zinc tin oxide (ZTO), indium zinc tin oxide (IZTO), indium gallium zinc tin oxide (IGZTO) and indium gallium oxide (IGO).

The light shielding layer 104 is located in the display area AA. The light shielding layer 104 contains the same elements as the first active layer 21. A material of the light shielding layer 104 may absorb at least part of ultraviolet light and transmit part of visible light. An orthogonal projection of the light shielding layer 104 on the base substrate 101 covers an orthogonal projection of the first channel region 311 on the base substrate 101. That is, the orthogonal projection area of the light shielding layer 104 on the base substrate 101 is greater than or equal to the orthogonal projection area of the first channel region 311 on the base substrate 101. In other words, the orthogonal projection of the first channel region 311 on the base substrate 101 is within the orthogonal projection of the light shielding layer 104 on the base substrate 101, or the orthogonal projection of the first channel region 311 on the base substrate 101 is coincided with the orthogonal projection of the light shielding layer 104 on the base substrate 101.

In the above-mentioned display substrate provided by the embodiments of the present disclosure, the light shielding layer 104 in the display area AA is arranged to have the same elements as the first active layer 21 in the frame area BB, and the light shielding layer may absorb at least part of ultraviolet light and transmit part of visible light. Therefore, under the condition that the light shielding layer 104 shields the first channel region 311 of the second active layer 31, not only may the light in the ultraviolet band in the backlight be filtered by the light shielding layer 104 to reduce the influence of illumination on the stability of the second transistor 103, but also, compared with a metal light shielding layer, the aperture ratio may be increased, and the high transmittance property of the light shielding layer 104 in the visible light band may also be used to improve the transmittance of a product. In addition, since the first transistor 102 is located in the frame area BB and the backlight only illuminates the display area AA, the stability of the first transistor 102 in the frame area BB will not be affected by the backlight.

Low-temperature polysilicon (LTPS) is purplish red, which may absorb ultraviolet light from 0 nm to 400 nm and transmit visible light from 400 nm to 700 nm. The absorption rate of the LTPS for ultraviolet light from 0 nm to 400 nm is 90% to 100%, and the transmittance for visible light from 400 nm to 700 nm is 10% to 55%. However, semiconductor oxide is most affected by ultraviolet light and less by visible light, therefore, the LTPS may be used as the light shielding layer 104 (that is, the material of the first active layer 21 may be the LTPS), so that the light shielding layer 104 may selectively transmit part of visible light and absorb ultraviolet light that has an influence on the second active layer 31 (for example, the material of the second active layer 31 is the semiconductor oxide). Compared with the metal light shielding layer, the aperture ratio may be improved and a process of separately preparing the light shielding layer 104 may be omitted.

In some embodiments, in the display substrate provided by the embodiments of the present disclosure, as shown in FIG. 1, there are a plurality of second transistors 103, and the plurality of second transistors 103 may be arranged in an array. The light shielding layer 104 includes first light shielding structures 1041 corresponding to the second transistors 103 one to one. The first light shielding structures 1041 are independent of each other. An orthogonal projection of each first light shielding structure 1041 on the base substrate 101 covers the orthogonal projection of the first channel region 311 of the corresponding second transistor 103 on the base substrate 101, so that negative influence of backlight on the first channel region 311 is avoided.

In some embodiments, as shown in FIGS. 1 and 2, the display substrate provided by the embodiments of the present disclosure may further include data lines 105 (on the same layer as first sources 33) located on a side of the second active layer 31 far away from the light shielding layer 104. Optionally, each data line 105 may be multiplexed with the first sources 33 of a column of second transistors 103. Moreover, after the first light shielding structures 1041 absorb the light in the ultraviolet band, a current will be generated inside the first light shielding structures 1041, and if the current fluctuates greatly, a signal on a conductor overlapping the first light shielding structures 1041 will be disturbed due to the parasitic capacitance between the first light shielding structures 1041 and the conductor overlapping the first light shielding structures. Therefore, in order to prevent the first light shielding structures 1041 from interfering with the signal on the data lines 105, it is arranged in the present disclosure that the orthogonal projection of the data lines 105 on the base substrate 101 and the orthogonal projection of the first light shielding structures 1041 on the base substrate 101 do not overlap each other.

Figure 3:
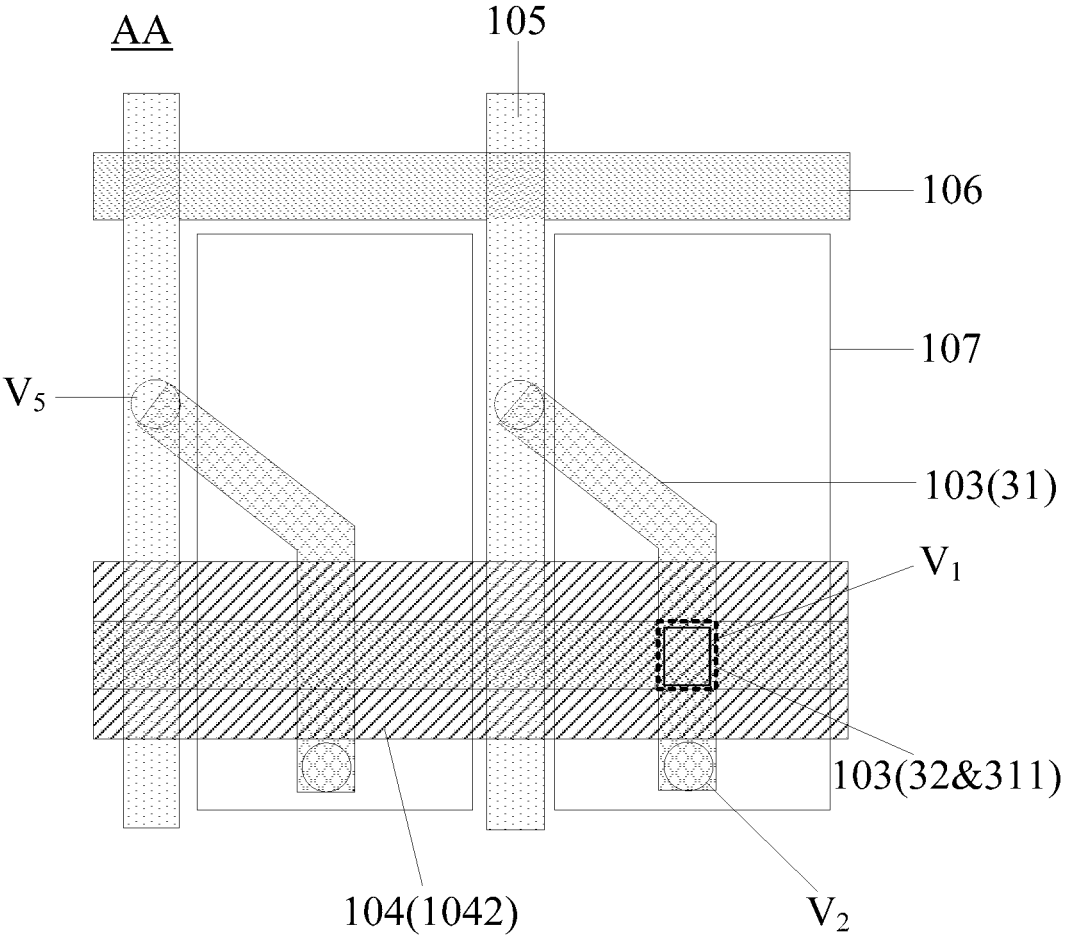
FIG. 3 is another schematic structural diagram of a display substrate provided by an embodiment of the present disclosure.

In some embodiments, in the above-mentioned display substrate provided by the embodiments of the present disclosure, as shown in FIG. 3, the light shielding layer 104 includes second light shielding structures 1042 corresponding to each row of second transistors 103 one to one, and an orthogonal projection of each second light shielding structure 1042 on the base substrate 101 correspondingly covers the orthogonal projection of the first channel regions 311 of the row of second transistors 103 on the base substrate 101, so as to avoid the negative influence of backlight on the first channel regions 311.

In some embodiments, as shown in FIGS. 2 and 3, the display substrate provided by the embodiments of the present disclosure may further include gate lines 106 (on the same layer as first gates 32) located between the second active layer 31 and the data lines 105 (on the same layer as the first sources 33). The gate lines 106 and the data lines 105 are crossed and insulated from each other. An orthogonal projection of the gate lines 106 on the base substrate 101 is located in the orthogonal projection of the second light shielding structures 1042 on the base substrate 101. The orthogonal projection of the data lines 105 on the base substrate 101 partially overlaps the orthogonal projection of the second light shielding structures 1042 on the base substrate 101. Because the second light shielding structures 1042 are of a strip structure, it is convenient to load the second light shielding structures 1042 with an electrical signal (for example, a fixed potential, the same signal as the gate lines 106, or the same signal as the data lines 105) through a peripheral circuit in the frame area BB. In this way, even if the second light shielding structures 1042 absorb the light in the ultraviolet band and generates a current inside, the electric signal of the second light shielding structures 1042 may be maintained through the peripheral circuit, thus avoiding the potential fluctuation of the second light shielding structures 1042 from interfering with the signals of the gate lines 106 and the data lines 105.

In some embodiments, in the display substrate provided by the embodiments of the present disclosure, as shown in FIG. 2, the first active layer 21 includes a second channel region 211, a source region 212 and a drain region 213. The second gate 22 is disposed above the second channel region 211. The source region 212 is connected to the second source 23. The drain region 213 is connected to the second drain 24. A material of the second channel region 211 is intrinsic polysilicon. Materials of the source region 212 and the drain region 213 are n-type polysilicon. The material of the light shielding layer 104 may be the same as that of the second channel region 211. That is, the material of the light shielding layer 104 may be intrinsic polysilicon. Alternatively, the material of the light shielding layer 104 may be the same as that of the source region 212 and the drain region 213. That is, the material of the light shielding layer 104 may also be n-type polysilicon. Since the intrinsic polysilicon is a semiconductor and the n-type polysilicon is a conductor, it is more beneficial to adjust the potential of the light shielding layer 104 when the material of the light shielding layer 104 is the n-type polysilicon. Further, the light shielding layer made of the n-type polysilicon may be multiplexed as a bottom gate of the second transistor 103, and the first gate 32 is a top gate of the second transistor 103, so that the second transistor 103 is of a double-gate structure. Optionally, the material of the first gate 32 may include a metal material, such as a single-layer or multi-layer structure formed of molybdenum, aluminum, titanium, copper, alloy, etc. Exemplarily, the first gate 32 is of a laminated structure composed of titanium metal layer/aluminum metal layer/titanium metal layer, and the carrier mobility of the n-type polysilicon is less than that of the first gate 32.

Figure 4:
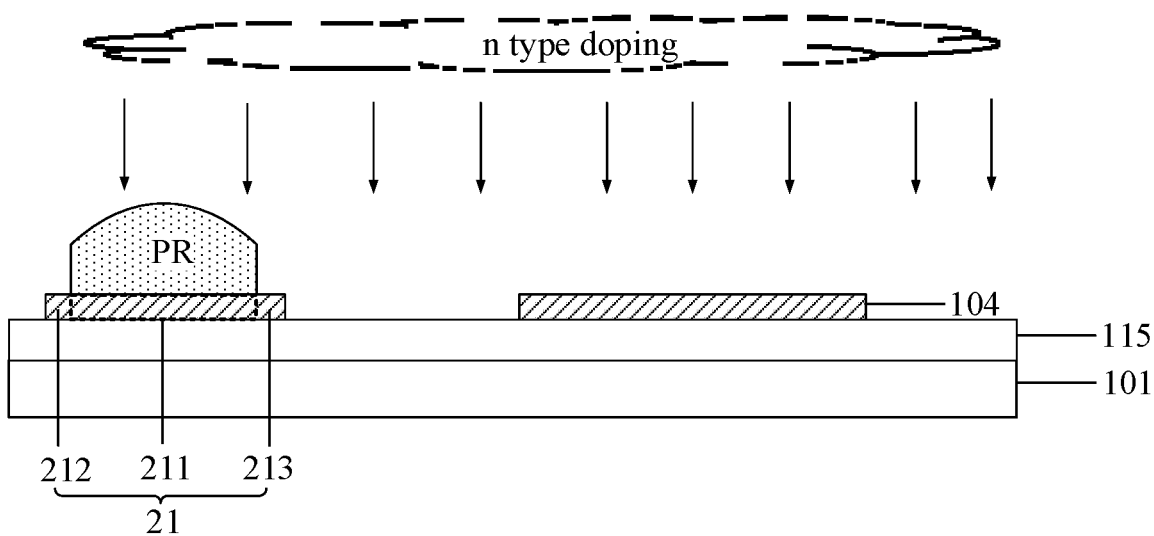
FIG. 4 is a schematic diagram illustrating doping treatment on a light shielding layer according to an embodiment of the present disclosure.

In some embodiments, as shown in FIG. 4, after patterns of the first active layer 21 and the light shielding layer 104 are formed, the second channel region 211 of the first active layer 21 may be shielded by photoresist (PR), and the exposed source region 212, drain region 213 and light shielding layer 104 are n-doped, so that the materials of the source region 212, drain region 213 and light shielding layer 104 are changed from the intrinsic polysilicon to the n-type polysilicon. Optionally, the number of boron (b) atoms per cubic centimeter of the n-type polysilicon is about $10^{19}$ to $10^{20}$.

In some embodiments, as shown in FIG. 2, the display substrate provided by the embodiments of the present disclosure may further include a first electrode 107 located on a side of a layer where the second transistor 103 is located far away from the base substrate 101, and a switching electrode 108 connecting the first electrode 107 and the second active layer 31. The switching electrode 108 is multiplexed as the first drain 34 of the second transistor 103. Optionally, in order to improve the transmittance, a material of the switching electrode 108 is a transparent conductive material, such as indium tin oxide (ITO), indium zinc oxide (IZO) and other transparent conductive materials.

In some embodiments, in the display substrate provided by the embodiments of the present disclosure, as shown in FIG. 2, the first gate 32 of the second transistor 103 may be located between a layer where the switching electrode 108 is located and the second active layer 31, and the first source 33 of the second transistor 103 may be located between a layer where the first gate 32 is located and the layer where the switching electrode 108 is located. The second gate 22 of the first transistor 102 is on the same layer and with the same material as the first gate 32, and the second source 23 and the second drain 24 of the first transistor 102 are on the same layer and with the same material as the first source 33, so as to save a patterning process, reduce the number of film layers, and facilitate the realization of light and thin product design.

In some embodiments, as shown in FIGS. 1 to 3, the display substrate provided by the embodiments of the present disclosure further includes a planarization layer 109 located between the layer where the first electrode 107 is located and the layer where the switching electrode 108 is located. The planarization layer 109 is provided with a first via hole $V_1$ for connecting the first electrode 107 and the switching electrode 108. An orthogonal projection of the first via hole $V_1$ on the base substrate 101 is at least partially located in the orthogonal projection of the first gate 32 on the base substrate 101, so as to shield the backlight through the first gate 32 and avoid light leakage at the first via hole $V_1$.

In some embodiments, as shown in FIGS. 1 to 3, the display substrate provided by the embodiments of the present disclosure may further include a first insulating layer 110 located between the layer where the first electrode 107 is located and the layer where the first source 33 is located, an interlayer dielectric layer 111 located between the layer where the first source 33 is located and the layer where the first gate 32 is located, and a first gate insulating layer 112 located between the layer where the first gate 32 is located and the second active layer 31. The first insulating layer 110, the interlayer dielectric layer 111, and the first gate insulating layer 112 include a second via hole $V_2$, and the switching electrode 108 is connected to the second active layer 31 through the second via hole $V_2$. Optionally, materials of the first insulating layer 110, the interlayer dielectric layer 111 and the first gate insulating layer 112 may all be inorganic insulating materials such as silicon oxide, silicon nitride, silicon oxynitride, etc., so that the second via holes $V_2$ penetrating through the first insulating layer 110, the interlayer dielectric layer 111 and the first gate insulating layer 112 may be formed by a one-time patterning process.

In some embodiments, as shown in FIG. 2, the display substrate provided by the embodiments of the present disclosure may further include a second electrode 113 located on a side of the layer where the first electrode 107 is located far away from the base substrate 101. An orthogonal projection of the third electrode 113 on the base substrate 101 at least partially overlaps the orthogonal projection of the first electrode 107 on the base substrate 101. Optionally, the present disclosure is applicable to liquid crystal display products, then the first electrode 107 is a pixel electrode, and the second electrode 113 is a common electrode. The common electrode may be a slit electrode. A second insulating layer 114 may be provided between the first electrode 107 and the second electrode 113. Alternatively, the present disclosure is applicable to organic light-emitting display products, then the first electrode 107 may be an anode and the second electrode 113 may be a cathode. A light-emitting functional layer is arranged between the first electrode 107 and the second electrode 113, so that the first electrode 107, the second electrode 113 and the light-emitting functional layer together form a light-emitting device (such as an organic light-emitting device OLED). The light-emitting functional layer includes but is not limited to a hole injection layer, a hole transport layer, an electron blocking layer, a light-emitting material layer, a hole blocking layer, an electron transport layer and an electron injection layer.

Correspondingly, embodiments of the present disclosure further provide a manufacturing method for the display substrate, and a manufacturing process is as follows.

Figure 5:
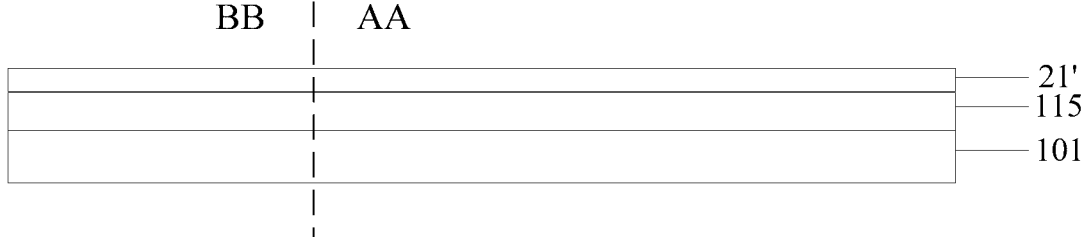
FIG. 5 is a schematic structural diagram of a display substrate provided by an embodiment of the present disclosure in a manufacturing process.

Step 1, a buffer layer 115 and an amorphous silicon layer 21' are sequentially formed on a base substrate 101, as shown in FIG. 5.

Figure 6:
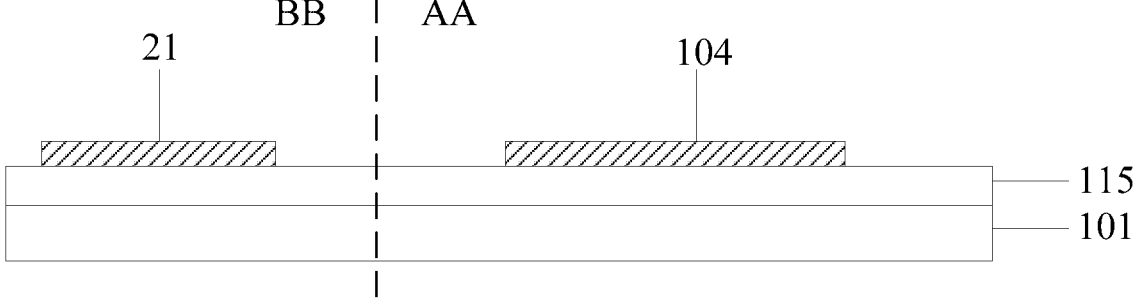
FIG. 6 is another schematic structural diagram of a display substrate provided by an embodiment of the present disclosure in a manufacturing process.

Step 2, the amorphous silicon layer 21' is crystallized so that the amorphous silicon layer 21' is converted into an intrinsic polysilicon layer, and then the intrinsic polysilicon layer is patterned to form a first active layer 21 in a frame area BB and a light shielding layer 104 in a display area AA, as shown in FIG. 6.

Step 3, as shown in FIG. 4, a second channel region 211 of the first active layer 21 is shielded by photoresist (PR), and an exposed source region 212 and drain region 213 of the first active layer 21 are n-doped, so that the intrinsic polysilicon of the source region 212 and drain region 213 is transformed into conductive n-type polysilicon. In some embodiments, the light shielding layer 104 may also be n-doped, so that the light shielding layer 104 also has conductivity. Alternatively, the light shielding layer 104 may not be n-doped, which is not limited here.

Figure 7:
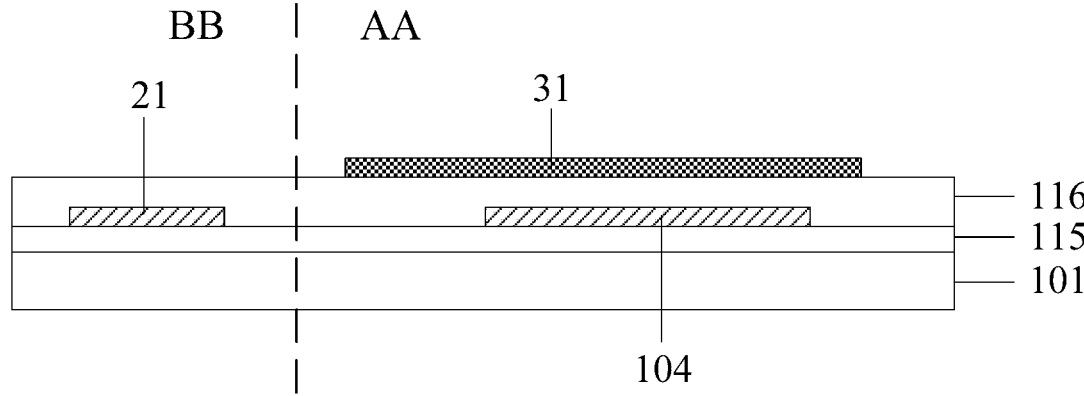
FIG. 7 is another schematic structural diagram of a display substrate provided by an embodiment of the present disclosure in a manufacturing process.

Step 4, a second gate insulating layer 116 and an oxide layer are sequentially formed on the first active layer 21 and the light shielding layer 104, and the oxide layer is patterned to form a second active layer 31 above the light shielding layer 104, as shown in FIG. 7.

Figure 8:
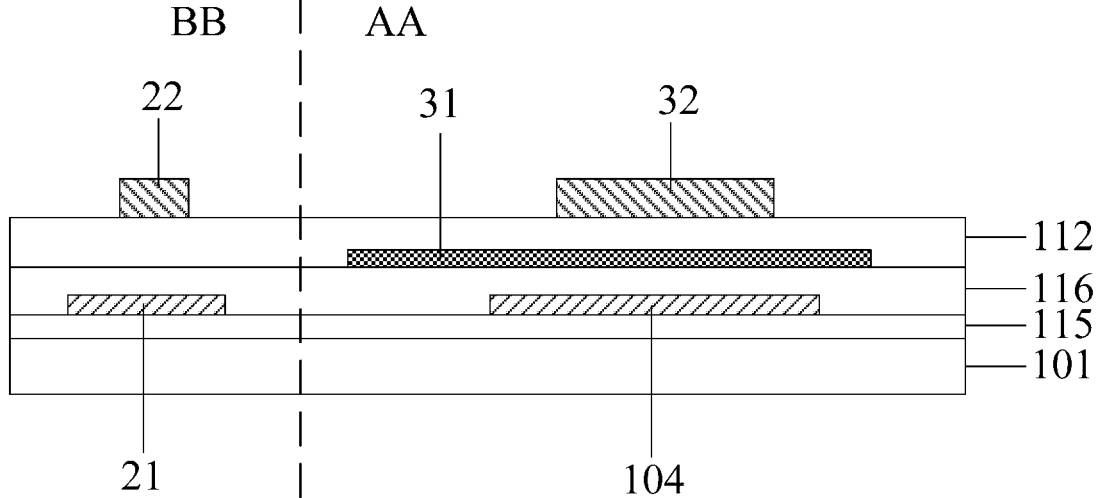
FIG. 8 is another schematic structural diagram of a display substrate provided by an embodiment of the present disclosure in a manufacturing process.

Step 5, a first gate insulating layer 112 and a gate metal layer are sequentially formed on the second active layer 31, and after patterning the gate metal layer, a first gate 32 above the second active layer 31 and a second gate 22 above the first active layer 21 are formed, as shown in FIG. 8.

Figure 9:
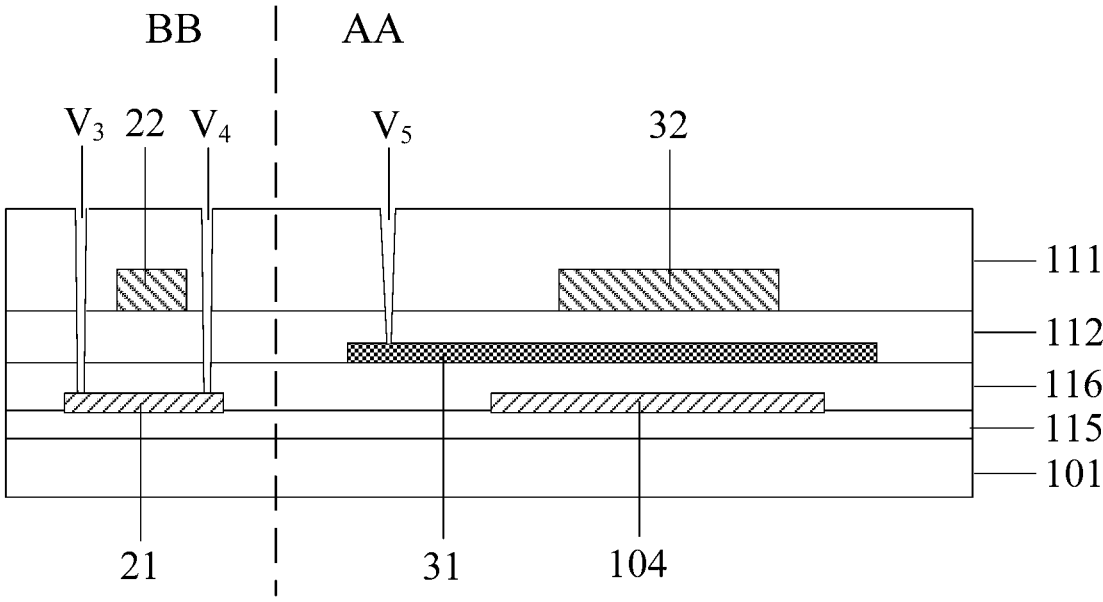
FIG. 9 is another schematic structural diagram of a display substrate provided by an embodiment of the present disclosure in a manufacturing process.

Step 6, an interlayer dielectric layer 111 is formed on a layer where the first gate 32 and the second gate 22 are located, and after patterning the interlayer dielectric layer 111, a third via hole $V_3$ and a fourth via hole $V_4$ penetrating the interlayer dielectric layer 111, a first gate insulating layer 112 and the second gate insulating layer 116 in the source region 212 and the drain region 213, and a fifth via hole $V_5$ penetrating the interlayer dielectric layer 111 and the first gate insulating layer 112 are formed, as shown in FIG. 9.

Figure 10:
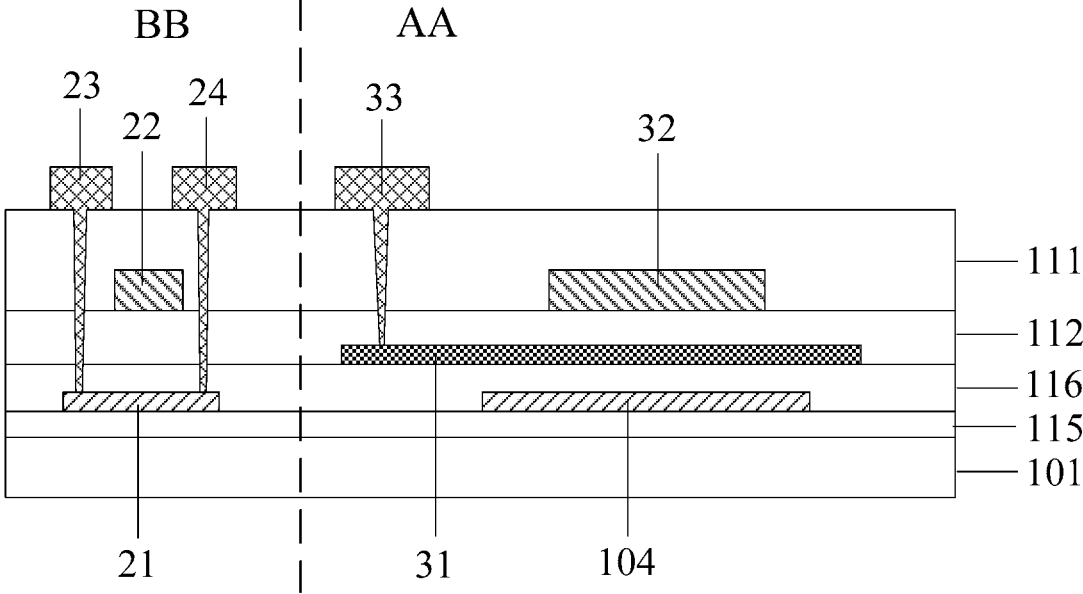
FIG. 10 is another schematic structural diagram of a display substrate provided by an embodiment of the present disclosure in a manufacturing process.

Step 7, a source-drain metal layer is formed on the interlayer dielectric layer 111 and patterned to form a second source 23 connected to the source region 212 through the third via hole $V_3$, a second drain 24 connected to the drain region 213 through the fourth via hole $V_4$, and a first source 33 connected to the second active layer 31 through the fifth via hole $V_5$, as shown in FIG. 10.

Figure 11:
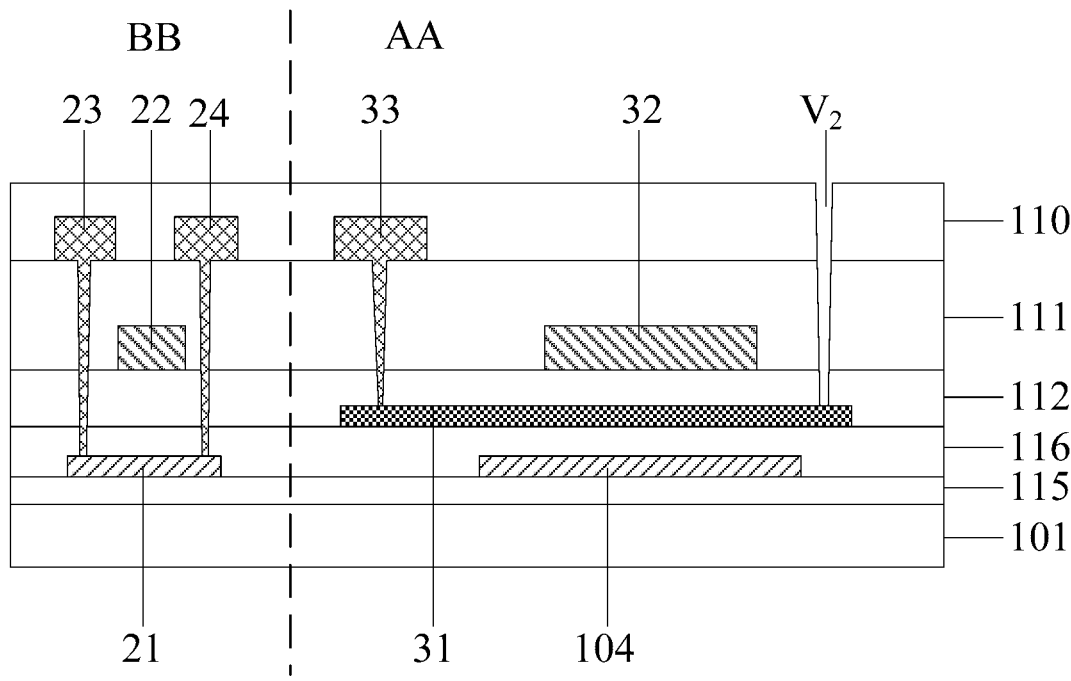
FIG. 11 is another schematic structural diagram of a display substrate provided by an embodiment of the present disclosure in a manufacturing process.

Step 8, a first insulating layer 110 is formed on the layer where the first source 33, the second source 23 and the second drain 24 are located. A second via hole $V_2$ for connecting the second active layer 31 and a subsequently manufactured switching electrode 108 is formed. The second via hole $V_2$ penetrates through the first insulating layer 110, the interlayer dielectric layer 111 and the first gate insulating layer 112, as shown in FIG. 11.

Figure 12:
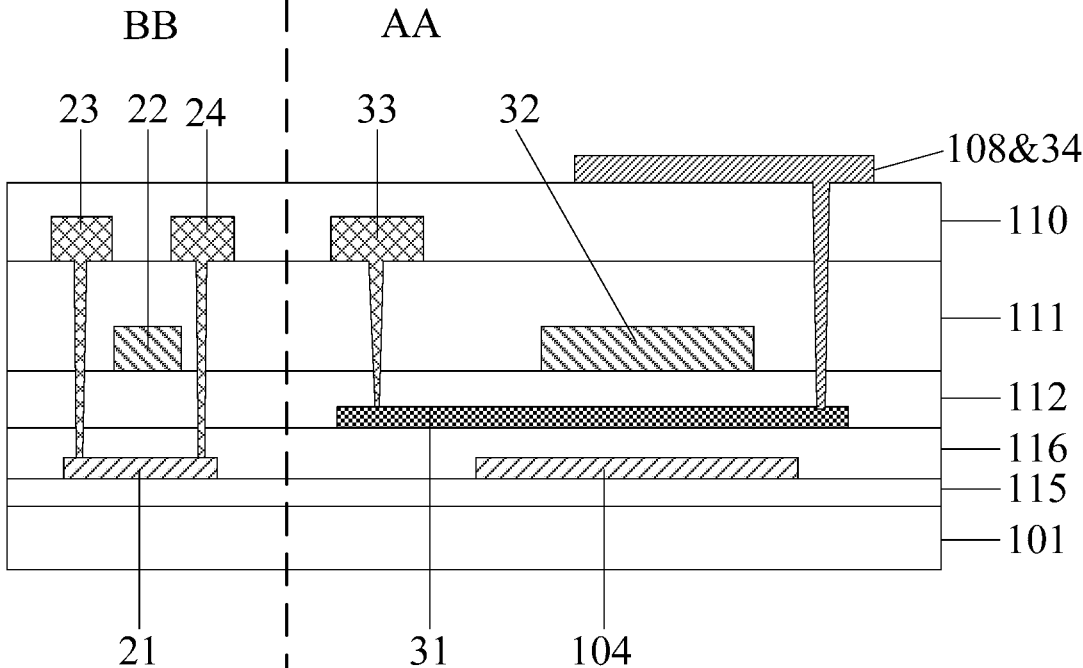
FIG. 12 is another schematic structural diagram of a display substrate provided by an embodiment of the present disclosure in a manufacturing process.

Step 9, a transparent conductive layer is formed on the first insulating layer 110, and after the transparent conductive layer is patterned, the switching electrode 108 is formed, so that the switching electrode 108 is connected with the second active layer 31 through the second via hole $V_2$, and the switching electrode 108 may be multiplexed as the drain 34 of the second transistor 103, as shown in FIG. 12.

Figure 13:
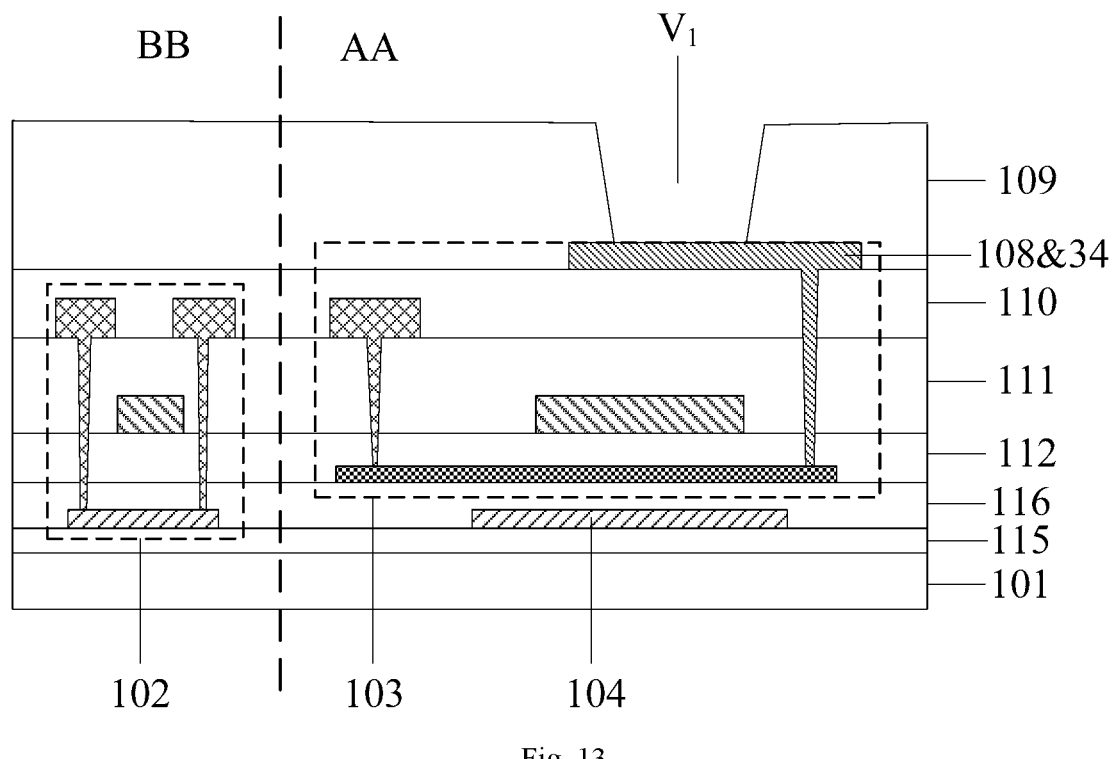
FIG. 13 is another schematic structural diagram of a display substrate provided by an embodiment of the present disclosure in a manufacturing process.

Step 10, a planarization layer 109 is formed on the layer where the switching electrode 108 is located, and the planarization layer 109 has a first via hole $V_1$ at least partially overlapping the first gate 32, as shown in FIG. 13.

Figure 14:
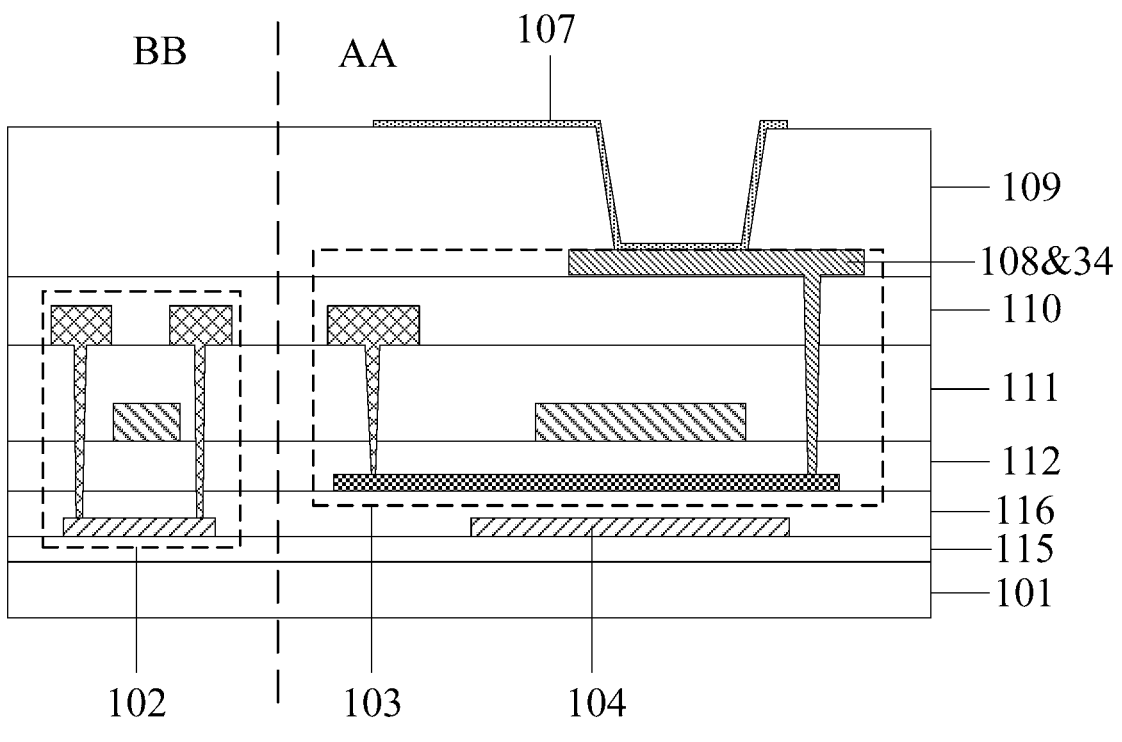
FIG. 14 is another schematic structural diagram of a display substrate provided by an embodiment of the present disclosure in a manufacturing process.

Step 11, a transparent conductive layer is formed on the planarization layer 109, and the transparent conductive layer is patterned to form a first electrode 107, so that the first electrode 107 is connected with the switching electrode 108 through the first via hole $V_1$, as shown in FIG. 14.

Figure 15:
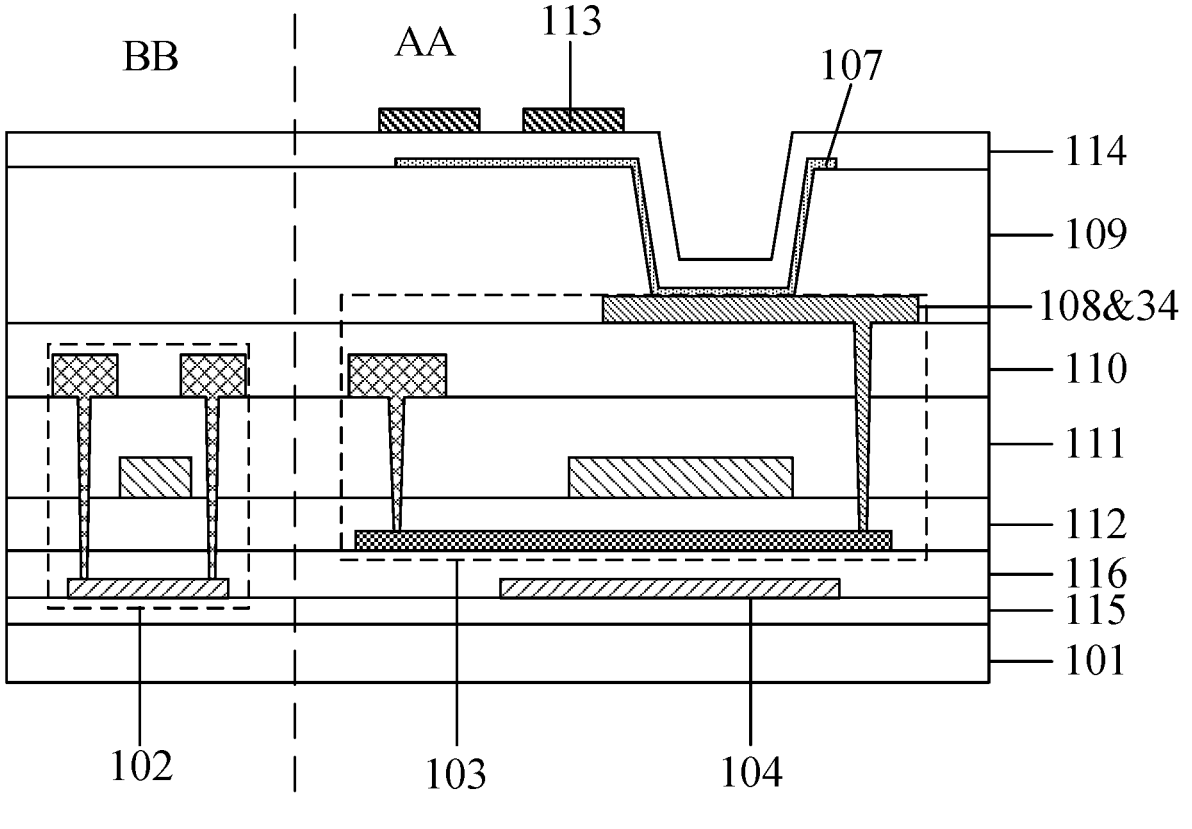
FIG. 15 is another schematic structural diagram of a display substrate provided by an embodiment of the present disclosure in a manufacturing process.

Step 12, a second insulating layer 114 and a transparent conductive layer are sequentially formed on a layer where the first electrode 107 is located, and after the transparent conductive layer is patterned, a second electrode 113 overlapping the first electrode 107 is formed, as shown in FIG. 15.

Step 13, a filling structure 117 is formed at the first via hole $V_1$ to improve the flatness at the first via hole $V_1$, as shown in FIG. 2.

Based on the same inventive concept, embodiments of the present disclosure further provide a display panel, including the display substrate provided by the embodiments of the present disclosure. Since the principle of solving the problem of the display panel is similar to that of the above-mentioned display substrate, the implementation of the display panel provided by the embodiments of this disclosure may refer to the implementation of the above-mentioned display substrate, and the repetition is omitted here.

In some embodiments, the display panel provided by the embodiments of the present disclosure may be an organic light-emitting display panel or a liquid crystal display panel. The liquid crystal display panel may include a display substrate and an opposite substrate which are opposite to each other, and a liquid crystal layer located between the display substrate and the opposite substrate. In the present disclosure, it is illustrated by taking an example that a first electrode 107 and a second electrode 113 are both arranged on the display substrate, and in some embodiments, the second electrode 113 may also be arranged on the opposite substrate.

Based on the same inventive concept, embodiments of the present disclosure further provide a display device, including the display panel provided by the embodiments of the present disclosure. Since the principle of the display device to solve problems is similar to that of the above-mentioned display panel, the implementation of the display device provided by the embodiments of the present disclosure may refer to the implementation of the above-mentioned display panel, and the repetition is omitted here.

In some embodiments, the display device provided by the embodiments of the present disclosure may be: mobile phones, tablet computers, televisions, displays, notebook computers, digital photo frames, navigators, smart watches, fitness wristbands, personal digital assistants and other products or components with display functions. The display device includes, but is not limited to: a radio frequency unit, a network module, an audio output & input unit, a sensor, a display unit, a user input unit, an interface unit, a memory, a processor, and a power supply. In addition, those skilled in the art can understand that the above-mentioned structure does not constitute a limitation to the above-mentioned display device provided by the embodiments of the present disclosure, in other words, the above-mentioned display device provided by the embodiments of the present disclosure may include more or fewer components, or combine some components, or have different component arrangements.

Although the present disclosure has described preferred embodiments, it should be understood that those skilled in the art can make various modifications and variations to the disclosed embodiments without departing from the spirit and scope of the disclosed embodiments. Thus, if these modifications and variations of the embodiments of the present disclosure are within the scope of the claims of the present disclosure and their equivalents, the present disclosure is also intended to include these modifications and variations.

What is claimed is:

1. A display substrate, comprising:
a base substrate comprising:
a display area, and
a frame area on at least one side of the display area;
a first transistor, located in the frame area and comprising:
a first active layer;
a second transistor, located in the display area and comprising:
a second active layer, located at a side, facing away from the base substrate, of the first active layer and comprising:
a first channel region; and
a light shielding layer in the display area;
wherein the light shielding layer comprises an element same as that in the first active layer;
a material of the light shielding layer is for absorbing at least part of ultraviolet light and transmitting part of visible light; and
an orthogonal projection of the light shielding layer on the base substrate covers an orthogonal projection of the first channel region on the base substrate;
wherein the first active layer comprises:
a source region, and
a drain region;
wherein materials of the source region and the drain region are n-type polysilicon; and the material of the light shielding layer is n-type polysilicon.

2. The display substrate according to claim 1, wherein there are a plurality of second transistors, and the light shielding layer comprises:
first light shielding structures, that correspond to the plurality of second transistors one to one and are independent of each other.

3. The display substrate according to claim 2, further comprising:
a data line at a side of the second active layer facing away from the light shielding layer;
wherein an orthogonal projection of the data line on the base substrate and an orthogonal projection of the first light shielding structures on the base substrate do not overlap each other.

4. The display substrate according to claim 1, wherein the first active layer is of a polysilicon material and the second active layer is of a semiconductor oxide material.

5. The display substrate according to claim 1, wherein there are a plurality of second transistors arranged in an array, and the light shielding layer comprises:

second light shielding structures corresponding to the second transistors in each row one to one.

6. The display substrate according to claim 5, further comprising:
a gate line and a data line, sequentially arranged on a side of the second active layer facing away from the light shielding layer and insulated from each other;
wherein an orthogonal projection of the gate line on the base substrate is within an orthogonal projection of the second light shielding structures on the base substrate, and an orthogonal projection of the data line on the base substrate partially overlaps the orthogonal projection of the second light shielding structures on the base substrate.

7. The display substrate according to claim 1, wherein the first active layer comprises:
a second channel region;
wherein a material of the second channel region is intrinsic polysilicon; and the material of the light shielding layer is intrinsic polysilicon.

8. The display substrate according to claim 1, further comprising:
a first electrode at a side, facing away from the base substrate, of a layer where the second transistor is located; and
a switching electrode connecting the first electrode and the second active layer;
wherein a material of the switching electrode is a transparent conductive material.

9. The display substrate according to claim 8, wherein:
the second transistor comprises:
a first source between a layer where the switching electrode is located and the second active layer;
the first transistor comprises:
a second source and a second drain in a same layer and with a same material as the first source.

10. The display substrate according to claim 9, wherein:
the second transistor comprises:
a first gate between a layer where the first source is located and the second active layer; the first transistor comprises:
a second gate in a same layer and with a same material as the first gate.

11. The display substrate according to claim 10, further comprising:
a planarization layer between a layer where the first electrode is located and the layer where the switching electrode is located;
wherein the planarization layer comprises:
a first via hole connecting the first electrode and the switching electrode;
wherein at least part of an orthogonal projection of the first via hole on the base substrate is located within an orthogonal projection of the first gate on the base substrate.

12. The display substrate according to claim 11, further comprising:
a filling structure formed in the first via hole;
wherein a surface of the filling structure away from the base substrate is substantially flush with a surface of the planarization layer away from the base substrate.

13. The display substrate according to claim 10, further comprising:
a first insulating layer between the layer where the first electrode is located and the layer where the first source is located;

an interlayer dielectric layer between the layer where the first source is located and a layer where the first gate is located; and a first gate insulating layer between the layer where the first gate is located and the second active layer;

wherein the first insulating layer, the interlayer dielectric layer and the first gate insulating layer comprise a second via hole penetrating through the first insulating layer, the interlayer dielectric layer and the first gate insulating layer, and the switching electrode is connected with the second active layer through the second via hole.

14. The display substrate according to claim 8, further comprising:

a second electrode on a side, facing away from the base substrate, of a layer where the first electrode is located.

15. The display substrate according to claim 14, further comprising:

a second insulating layer between the first electrode and the second electrode.

16. The display substrate according to claim 8, wherein the switching electrode is multiplexed as a first drain of the second transistor.

17. A display panel, comprising the display substrate according to claim 1.

18. A display device, comprising the display panel according to claim 17.

19. The display substrate according to claim 1, further comprising:

a buffer layer between the base substrate and the light shielding layer; and a second gate insulating layer between the light shielding layer and the second active layer.

* * * * *